United States Patent [19]
Crafts et al.

[11] Patent Number: 5,920,110
[45] Date of Patent: Jul. 6, 1999

[54] ANTIFUSE DEVICE FOR USE ON A FIELD PROGRAMMABLE INTERCONNECT CHIP

[75] Inventors: Harold S. Crafts, Colorado Springs; Maurice M. Moll, Fort Collins, both of Colo.

[73] Assignee: LSI Logic Corporation, Milpitas, Calif.

[21] Appl. No.: 09/070,188

[22] Filed: Apr. 30, 1998

Related U.S. Application Data

[62] Division of application No. 08/534,008, Sep. 26, 1995, Pat. No. 5,844,297.

[51] Int. Cl.$^6$ ................................................. H01L 23/02
[52] U.S. Cl. ........................ 257/530; 257/528; 257/529; 257/758; 257/209; 257/207; 438/600
[58] Field of Search ..................................... 257/529, 532, 257/518, 754, 756, 758, 370, 348, 66, 903, 904, 588–590, 511, 517, 382, 530, 50, 52, 57, 209; 438/600

[56] References Cited

U.S. PATENT DOCUMENTS

| | | | |
|---|---|---|---|
| 4,106,051 | 8/1978 | Dermer et al. | 257/756 |
| 4,442,507 | 4/1984 | Roesner | 365/100 |
| 4,748,450 | 5/1988 | Hollingsworth | 257/530 |
| 4,764,801 | 8/1988 | Mclaughlin et al. | 257/756 |
| 4,796,074 | 1/1989 | Roesner | 357/51 |
| 4,884,122 | 11/1989 | Eichelberger et al. | 257/48 |
| 5,015,599 | 5/1991 | Verhaar | 437/44 |
| 5,026,663 | 6/1991 | Zdebel et al. | 437/160 |
| 5,070,384 | 12/1991 | McCollum et al. | 257/530 |
| 5,070,391 | 12/1991 | Liou et al. | 357/71 |
| 5,073,810 | 12/1991 | Owada et al. | 252/754 |
| 5,091,763 | 2/1992 | Sanchez | 357/23.9 |
| 5,091,769 | 2/1992 | Eichelberger | 257/687 |
| 5,095,362 | 3/1992 | Roesner | 357/23.4 |
| 5,106,773 | 4/1992 | Chen et al. | 437/51 |
| 5,111,278 | 5/1992 | Eichelberger | 257/698 |
| 5,132,878 | 7/1992 | Carey | 361/410 |
| 5,151,759 | 9/1992 | Viral | 257/348 |
| 5,166,556 | 11/1992 | Hsu et al. | 307/465 |
| 5,171,715 | 12/1992 | Husher et al. | 437/195 |
| 5,196,724 | 3/1993 | Gordon et al. | 257/530 |
| 5,242,851 | 9/1993 | Choi | 257/530 |
| 5,250,843 | 10/1993 | Eichelberger | 257/692 |
| 5,258,891 | 11/1993 | Sako | 361/792 |
| 5,266,828 | 11/1993 | Hamdy et al. | 257/530 |
| 5,296,722 | 3/1994 | Roesner | 257/50 |
| 5,311,032 | 5/1994 | Kimura et al. | 257/530 |
| 5,311,053 | 5/1994 | Law et al. | 257/529 |
| 5,319,238 | 6/1994 | Gordon et al. | 257/530 |
| 5,371,390 | 12/1994 | Mohsen | 257/209 |
| 5,411,917 | 5/1995 | Foronhi et al. | 257/530 |
| 5,434,448 | 7/1995 | Wei | 257/530 |
| 5,497,027 | 3/1996 | Crafts | 257/528 |
| 5,502,315 | 3/1996 | Chua et al. | 257/530 |
| 5,512,765 | 4/1996 | Graverick | 257/702 |
| 5,572,061 | 11/1996 | Cher et al. | 257/756 |
| 5,581,111 | 12/1996 | Chen | 257/530 |
| 5,606,188 | 2/1997 | Brunner et al. | 257/401 |
| 5,635,761 | 6/1997 | Cao et al. | 257/700 |
| 5,679,974 | 10/1997 | Shariks et al. | 257/530 |
| 5,717,253 | 2/1998 | Shin et al. | 257/754 |

FOREIGN PATENT DOCUMENTS

| | | | |
|---|---|---|---|
| 55-27645 | 2/1980 | Japan | 257/756 |
| 1-251757 | 10/1989 | Japan | 257/756 |

*Primary Examiner*—Alexander Oscar Williams
*Attorney, Agent, or Firm*—Wayne P. Bailey

[57] ABSTRACT

This interconnect chip provides the function of an antifuse device. The interconnect chip is initially disconnected. Application of a high voltage applied across two terminals on the chip causes intrinsic polysilicon, which serves as an insulator between the connections to break down and form a reliable short circuit between the pads by redistribution of impurities from the layers above and below the intrinsic polysilicon.

12 Claims, 7 Drawing Sheets

ANTIFUSE DEVICE FOR USE ON A FIELD PROGRAMMABLE INTERCONNECT CHIP

This application is a Div of Ser. No. 08/534,008 filed Sep. 26, 1995 now U.S. Pat. No. 5,844,297.

BACKGROUND OF THE INVENTION

1. Technical Field

The present invention relates generally to the field of integrated circuit technology and in particular to a programmable interconnect device for use in a multi-chip module. Still more particularly, the present invention relates to an improved antifuse device for use on a field programmable interconnect chip.

2. Description of the Related Art

Packaging is considered by many in the industry to be the pacing technology for integrated chip (IC) development. Advances in packaging technology have lead to multi-chip modules for complex digital systems. Multi-chip modules have various advantages over systems based on PC boards. For example, in high performance systems, a longer amount of time is required to design and fabricate a PC board system having an equivalent performance to a system based on multi-chip modules. Additionally, exotic materials are typically required to construct a PC board system having the equivalent performance of a system based on multi-chip modules.

Multi-chip modules, however, still have some impediments to wide spread use in the computer industry. One problem is the longer development time in systems other than high performance systems, required to design and fabricate a system based on multi-chip modules relative to the time required for an equivalent system based on PC boards.

One item causing increased time in design and fabrication of multi-chip modules is the system employed to interconnect various chips within a multi-chip module. In particular, connections are required to connect various pads between chips on the multi-chip module. Presently, interconnections must be specifically designed for the particular connections required between various chips on a particular multi-chip module. These interconnects must either be hardwired on the multi-chip module or in the form of application specific integrated chips that provide the required connections between other chips on the multi-chip module. Therefore, it would be advantageous to have an improved apparatus for interconnecting chips on a multi-chip module.

SUMMARY OF THE INVENTION

The present invention provides a one time-field programmable interconnect chip. This interconnect chip is implemented through the use of several antifuse devices. The interconnect chip contains numerous potential connections that are initially disconnected. Application of a high voltage applied across two terminals on the chip causes intrinsic polysilicon, which serves as an insulator between the connections, to form a reliable short circuit between the pads through the redistribution of impurities from the doped polysilicon layers above and below the intrinsic polysilicon. Application of voltages across selected terminals on the interconnect chip provides programmable connections to other chips connected to the interconnect chip. Other objects and advantageous of the invention will become readily apparent from the ensuing description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but are drawn as to illustrate the important features of the invention.

Figure 1:
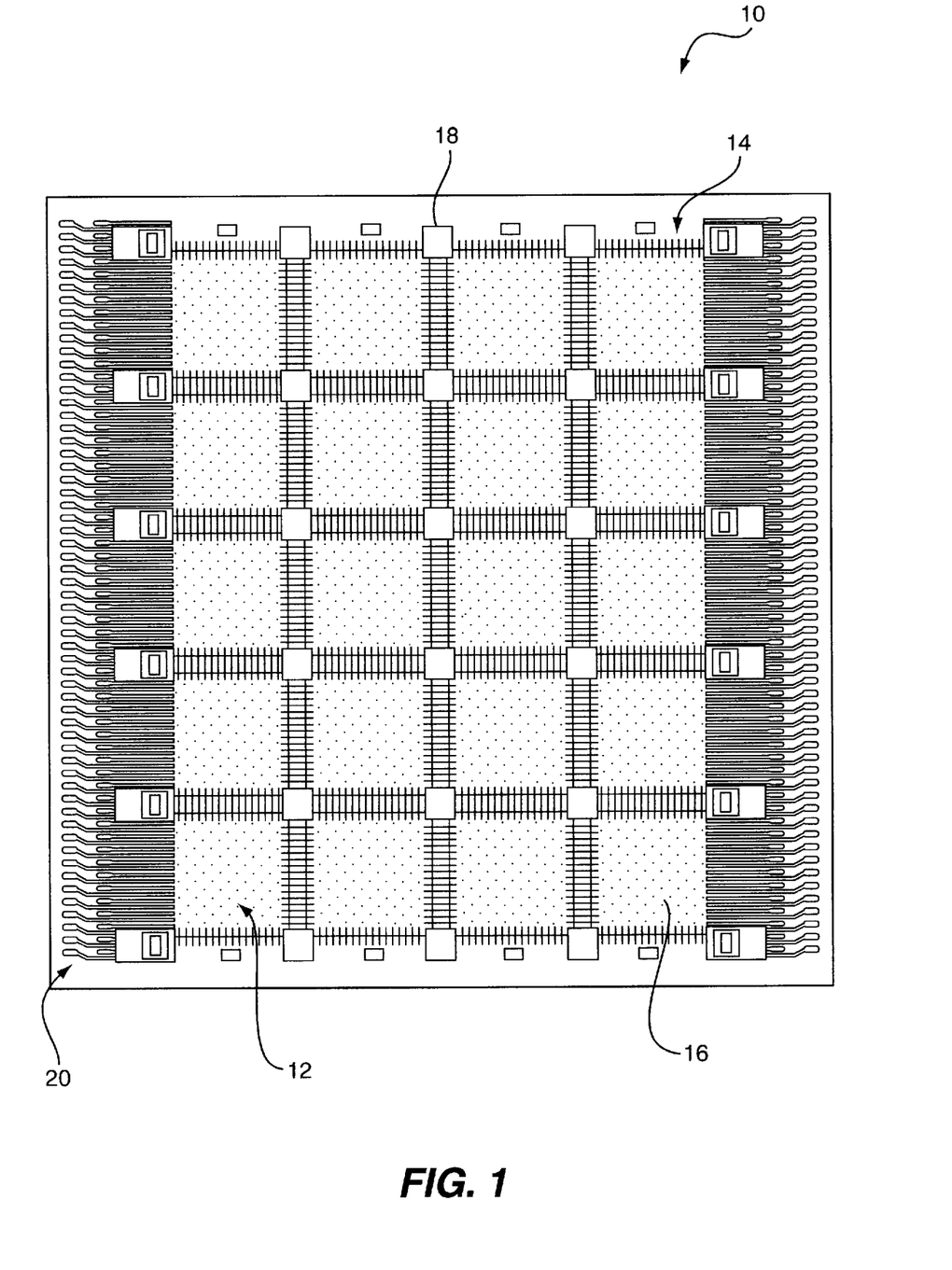
FIG. 1 is a top view of a multi-chip module is depicted in which the present invention may be implemented.

With reference now to the figures, and in particular with reference to FIG. 1, a top view of a multi-chip module is depicted in which the present invention may be implemented. Substrate 10 is made of co-fired ceramic and contains a plurality of die mounting locations 12 indicated by the squares in FIG. 1. A single layer of high resolution metal interconnect pattern 14 is employed to connect adjacent chips together. A ceramic substrate is employed for substrate 10 in the depicted example because it provides a good thermal coefficient of expansion matching the various silicon dies that may be placed on substrate 10, thereby enhancing the reliability of the system.

The chip-to-chip interconnect pattern 14 is etched into a copper layer (not shown) deposited on the surface of substrate 10. The interconnects are approximately 50 micrometers wide on 100 micrometer centers. Interconnect pattern 14 preferably matches the pads or outer leads of the Tape Automated Bonding (TAB) frames (not shown) used to attach chips to substrate 10. TAB frames are used to connect the pads on the chips to substrate 10 although wire bonding may be used. A layer of polyimide 16 is added over the copper for scratch protection. Power and ground planes are deposited within substrate 10 and are accessed through vias 18. An edge connector pattern 20 also is etched into a copper layer.

Figure 2:
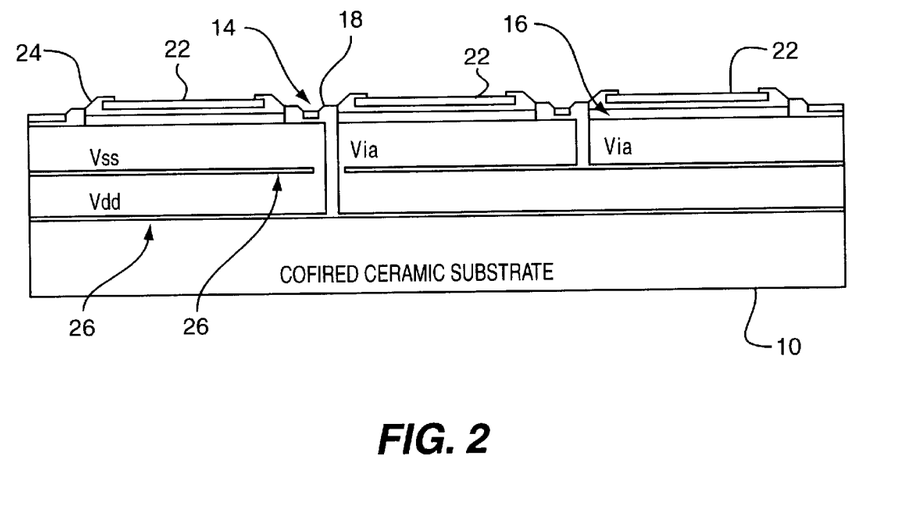
FIG. 2 is a cross-section of the substrate depicted in FIG. 1.

FIG. 2 is a cross-section of substrate 10 in FIG. 1, showing chips 22 mounted on substrate 10 and electrically coupled to interconnect pattern 14 using TAB frames 24. Vias 18 access power and ground planes 26 deposited within the co-fired ceramic substrate 10. Chips 22 can either be interconnect chips or logic chips, or the interconnect and logic can be combined into a single chip. Regardless, most of the interconnect is contained on chips 22 mounted on substrate 10. In a typical case, approximately half of these chips 22 will be interconnect chips rather than logic chips and are used primarily to connect one chip 22 to another chip 22 across substrate 10 according to the present invention.

The present invention contains a number of different types of logic chips that may be mounted on substrate 10. Standard gate array chips designed to fit die mounting locations 12 on substrate 10 may be employed. This type of gate array is are on the order of 10 millimeter square and may contain 25,000 to 50,000 gates or more. The gate array typically features close pad spacing, on the order of 100 microns, so that many leads can be used. Approximately, 100 pins are located on each edge of the gate array.

Another type of logic chip that may be employed is a standard IC that has been adapted to die mounting locations 12 with a custom TAB frame 24. Standard ICs may be employed for functions such as memory and microprocessors, where the density of the standard devices offer a significant cost and performance advantages over gate arrays. Another alternative employs programmable logic in one or more of its various forms, such as programmable array logic devices. Also, field programmable gate arrays may be used for more complex logic at somewhat reduced clock rates.

All of these various logic chips may be interconnected with each other by employing programmable interconnect chips according to the present invention. The interconnect chip of the present invention is a one time field programmable interconnect chip that provides the function of an antifuse. An "antifuse" is a structure, which when unprogrammed does not electrically couple its first and second terminals, but which, when programmed by applying sufficient voltage between the first and second terminals, permanently electrically connects the first and second terminals.

In particular, the interconnect on the chip is initially open or disconnected. When a high voltage is applied across two of the pads on the chip, the depletion layer reaches all the way through the intrinsic polysilicon layer. This causes an electric current to flow, and the resulting heating of the dielectric causes dopants to diffuse from the doped layers through the intrinsic layer. The mechanism for forming a connection is described in more detail below.

According to the present invention the interconnect chip is employed in the multi-chip module to provide an electrically programmable interconnect for a standard substrate. The standard multi-chip module provides an interconnect between adjacent chips in the chip array. Specific interconnects to connect particular pins between logic chips are provided by these one time programmable interconnect chips. Logic on the module is implemented and various forms as described above.

Figure 3:
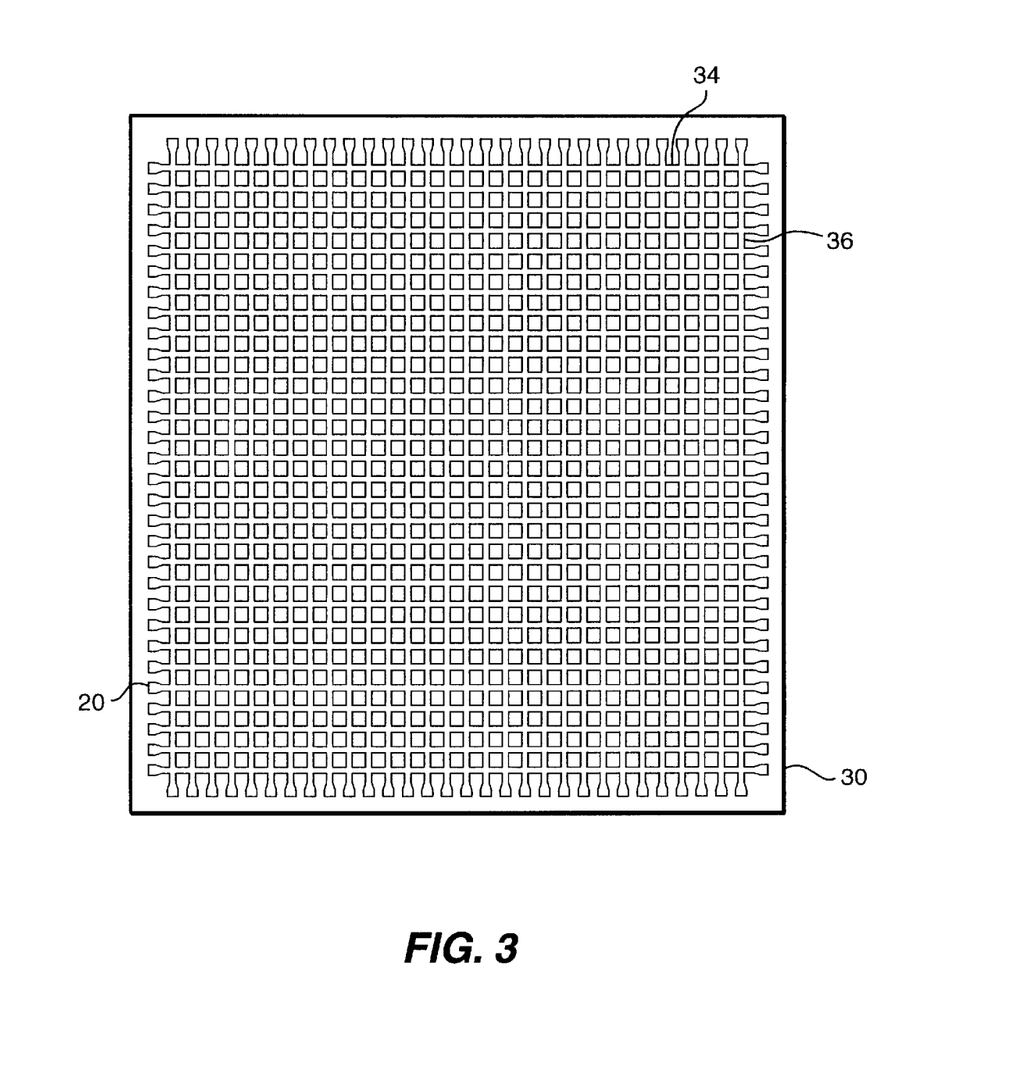
FIG. 3 illustrates a top view of an interconnect chip.
Figure 4:
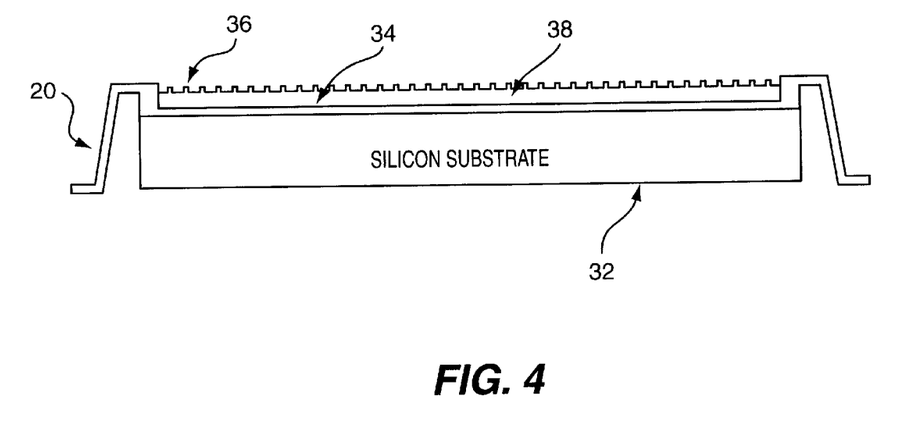
FIG. 4 illustrates a cross-section view of an interconnect chip.

FIG. 3 illustrates a top view and FIG. 4 illustrates a cross-sectional view of an interconnect chip 30 according to the present invention. The interconnect chip is constructed from a silicon substrate 32 and contains an interconnect pattern comprising two orthogonal metal lines 34 and 36 separated by a dielectric layer 38 with vias (not shown) interconnecting two sets metal lines 34 and 36. The interconnect pattern of FIGS. 3 and 4 is fabricated using two standard metal masks and a standard via mask according to the present invention. The orthogonal layers terminate in bonding pads 20 for TAB frames or wire bonds.

Interconnect chip 30 is programmed by impressing a programming voltage on one horizontal metal line and one vertical metal line to "blow" the antifuse and introduce the electrical connection. The programmable interconnect chip bonding pad layout is chosen to be identical to that of a traditional gate array according to the present invention.

Figure 5:
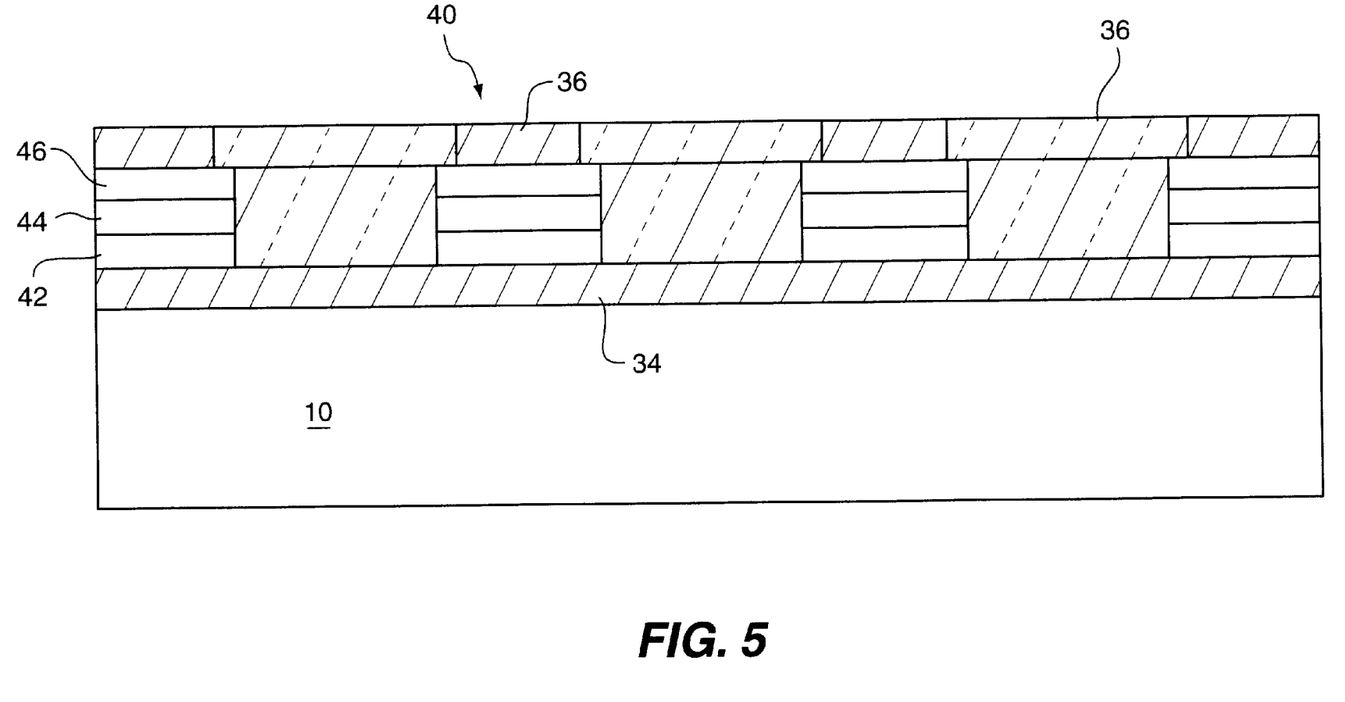
FIG. 5 illustrates a more detailed cross-section view of a portion of the interconnect chip depicted in FIG. 4.

Turning now to FIG. 5, a more detailed cross-sectional view of interconnect chip 30 is depicted according to the present invention. As can be seen, each unprogrammed via 40 contains a doped polysilicon layer 42 under an intrinsic polysilicon layer 44 with another doped polysilicon layer 46 over the intrinsic polysilicon layer 44. In essence, intrinsic polysilicon layer 44 is "sandwiched" between doped polysilicon layers 42 and 46. Intrinsic polysilicon layer 44 prevents any electrical connection between metal line 34 and metal line 36 under normal usage. Doped polysilicon layers 42 and 46 are heavily doped with impurities such as, for example, aluminum. Upon application of an excess voltage, a current is forced through the polysilicon layer 44, heating it to the point where, in the presence of an electric field, the impurities from doped polysilicon layers 42 and 46 diffuse through intrinsic polysilicon layer 44. These impurities render intrinsic polysilicon layer 44 permanently conductive—"blowing" the antifuse. Typically, metal line 34 is a refractory metal line, and metal line 36 also is a refractory metal line. Other conductive materials may be used in place of metal lines 34 and 36 according to the present invention.

The thickness of intrinsic polysilicon layer 44 is an important parameter in interconnect chip 30. The intrinsic polysilicon layer 44 may range from about 0.1 micrometers to 0.5 micrometers in the depicted example. Heavily doped polysilicon layers 42 and 46 may range from about 100 Å to about 500 Å. The thickness of intrinsic polysilicon layer 44 will depend on the operating voltage on which the multi-chip module runs. If the intrinsic polysilicon layer 44 is too thin, the operating voltage will cause diffusion of impurities into the intrinsic polysilicon layer 44 and cause a short circuit when one is not desired. The thickness of the intrinsic polysilicon layer 44 must be thick enough so that the resistance that is present is normally very high at the worst case supply voltage to the interconnect chip 30.

The thickness, however, must not be too great, or the voltage required to break down the connections will be high enough to damage or destroy the dielectric insulation elsewhere between the metal layers. If the intrinsic polysilicon layer 44 is too thick, the voltage required to cause enough impurities to diffuse into intrinsic polysilicon layer 44 also will break down the dielectric separating metal lines 34 and 36.

Diffusion occurs from either doped polysilicon layer 42 and 46 into intrinsic polysilicon layer 44. The connection is made by grounding all of the pads except the two where the short is desired. One of these remaining pads is raised in voltage, while the other pad is lowered according to the present invention. The applied voltage is selected such that intrinsic silicon layer 44 in the selected antifuse becomes permanently conductive.

In a system operating at 5 volts with a 7 volt maximum, an antifuse according to the present invention would be programmed or "blown" using a voltage of approximately 15 volts. In such a system, a short may be created in the antifuse by raising the voltage across a metal line 36 to a plus 7.5 volts and lowering the voltage of metal line 34 to a minus 7.5 volts for a voltage difference of 15 volts. This causes the antifuse to be "blown" in programming a connection in the via where these two lines cross. The thickness of the layers in an antifuse will vary depending on the application and operating voltages.

Figure 6:
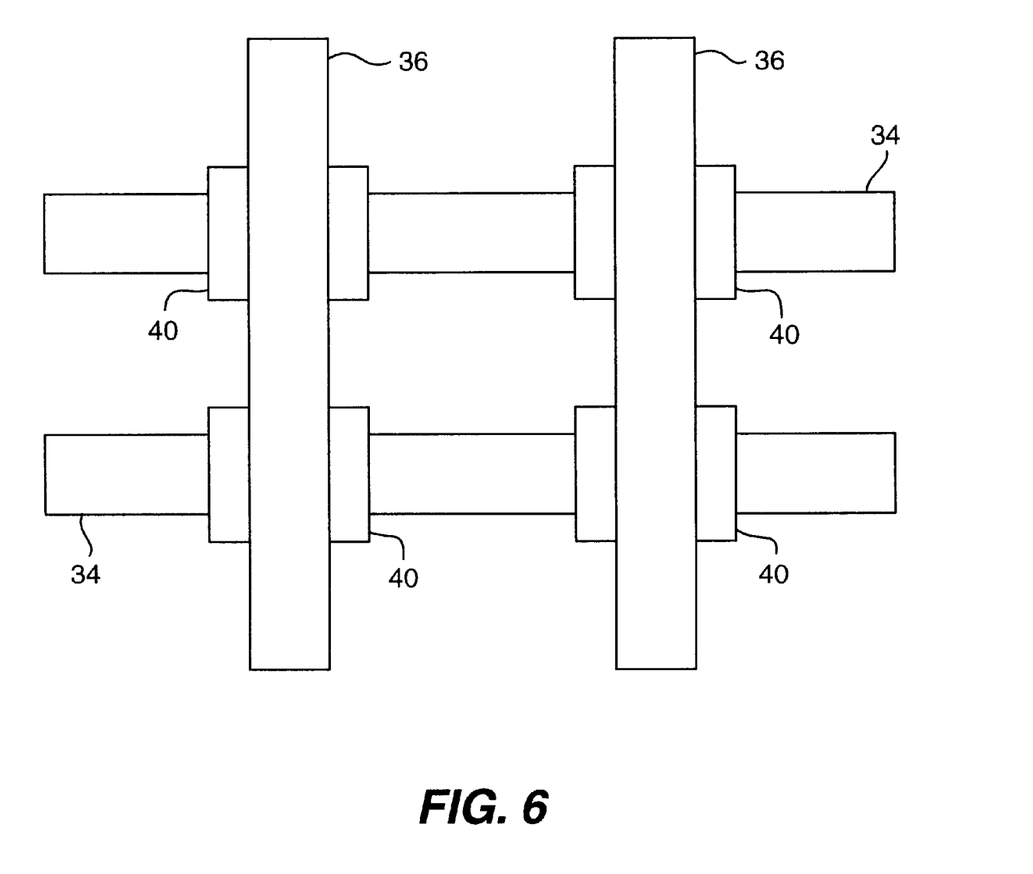
FIG. 6 is a more detailed top view of a portion of the programmable interconnect structure depicted in FIG. 3.

Turning now to FIG. 6, a more detailed top view of the programmable interconnect structure in the interconnect chip 30 is depicted according to the present invention. As can be seen metal lines 34 and 36 cross in a periodic array. The polysilicon sandwich, containing the intrinsic polysilicon layer between doped polysilicon layers 42 and 46 is located in via 40 at the point where metal lines 34 and 36 cross each other. The doped polysilicon layers 42 and 46 are in electrical contact with metal lines 34 and 36 respectively. In the unprogrammed form, intrinsic polysilicon layer 44 is located between doped polysilcon layers 42 and 46. In the programmed antifuses, intrinsic polysilicon layer 44 contains sufficient amounts of impurities to provide an electrical connection between metal lines 34 and 36. According to the present invention, each via 40 in the interconnect chip 30 is square in shape and is from about 1.0 micrometers to about 2.0 micrometers across.

Figure 7A:
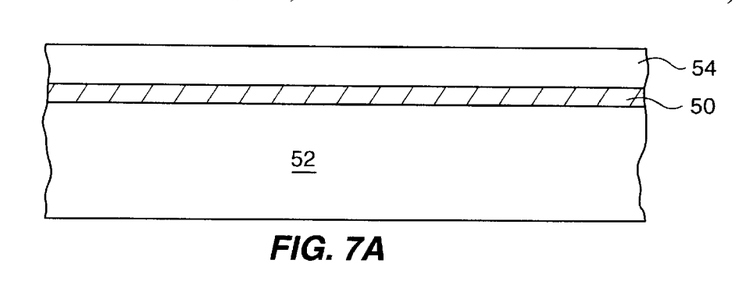
FIGS. 7A–7F depict a process for creating an antifuse for use in an interconnect chip.

FIGS. 7A–7F depict a process for creating an antifuse for use in an interconnect chip according to the present invention. The layers in FIGS. 7A–7F are generally deposited using chemical vapor deposition. Other methods known to those skilled in the art also may be used to form the layers in these figures. In FIG. 7A, metal layer 50 is deposited over silicon substrate 52. Metal layer 50 is then etched to form the metal lines. The metal layer is typically from about 0.5 micrometers to about 1.0 micrometers thick. Metal layer 50 is a refractory metal in the depicted example. Chemical vapor deposition is the preferred method for depositing tungsten while physical vapor deposition is used for other refractory metals, such as TiN, Ti, and Mo.

A refractory metal, such as tungsten, is chosen because of its high melting temperature. Typically, in creating a short circuit according to the present invention, high local temperatures are created during the diffusion of dopants from the doped polysilicon layer into the intrinsic polysilicon layer. Typically a refractory metal is used in to obtain a high enough working temperature to deposit polysilicon and have the polysilicon recrystallize. Thereafter, heavily doped polysilicon layer 54 is formed over metal lines 50 and silicon substrate 52. Doped polysilicon layer 58 may be formed by using a shallow implant, such as, for example, phosphorous. Doped polysilicon layer 54 is from about 200 Å to about 500 Å thick. This polysilicon layer may be formed by growing intrinsic polysilicon and diffusing or implanting dopants into the layer. Alternatively, doped polysilicon layer may be directly deposited using chemical vapor deposition, evaporation, or sputtering techniques known to those of ordinary skill in the art.

Figure 7B:
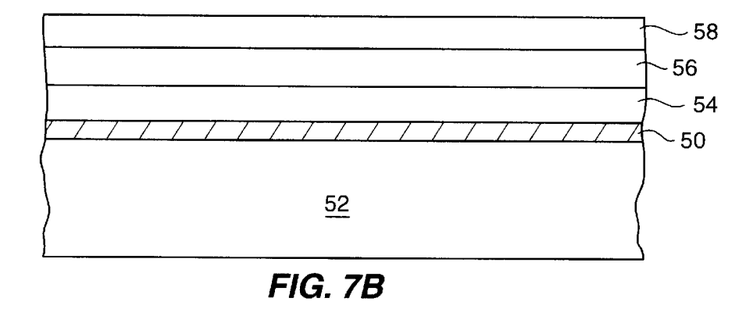
Figure 7C:
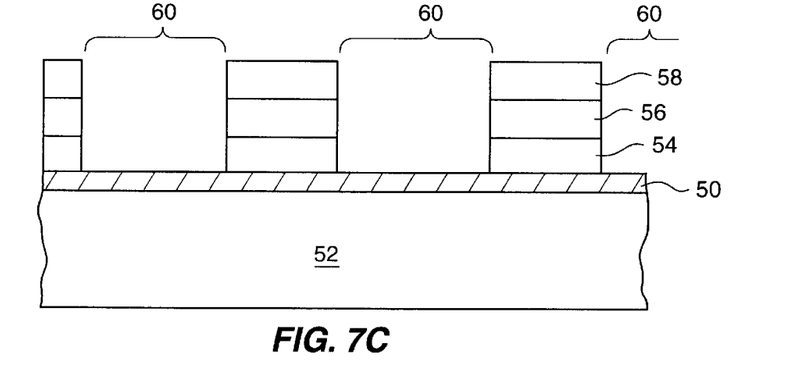
Figure 7D:
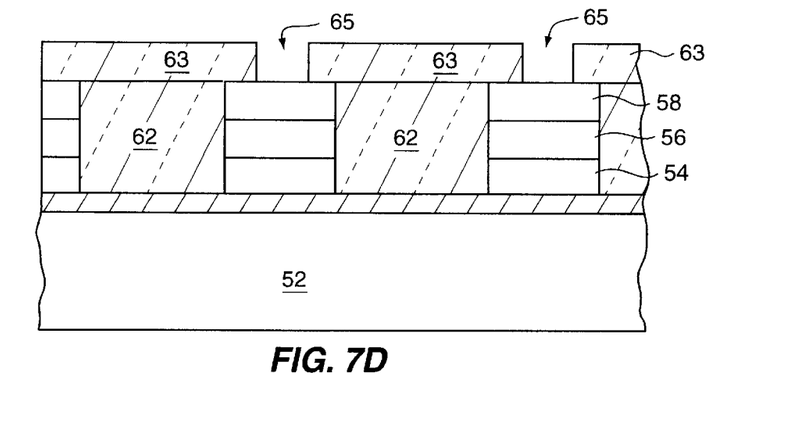
Figure 7E:
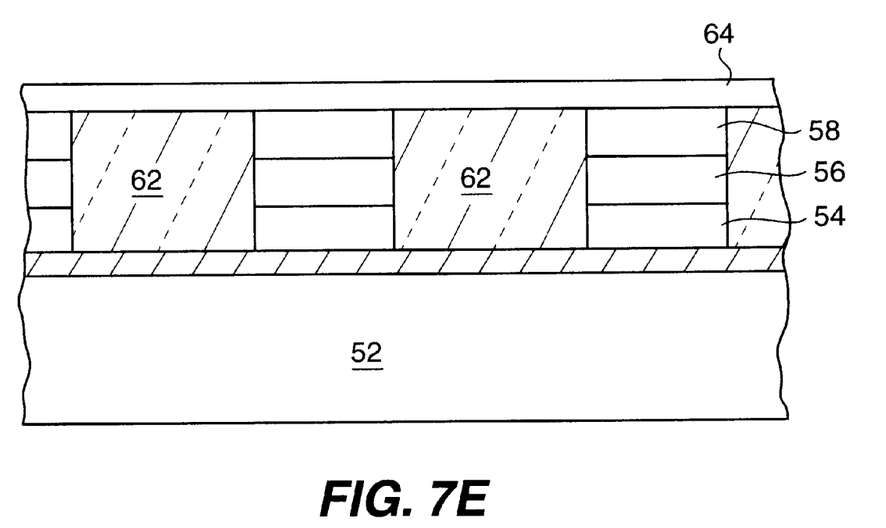
Figure 7F:
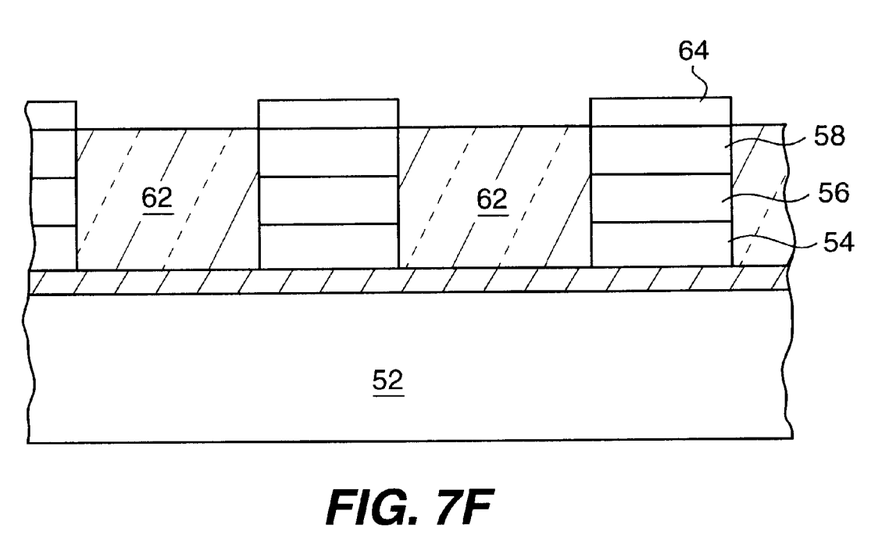

Next in FIG. 7B, intrinsic polysilicon layer 56 is formed over polysilicon layer 54. Another doped polysilicon layer 58 is then formed over polysilicon layer 56. Intrinsic polysilicon layer 56 is from about 5000 Å to about 10,000 Å thick while doped polysilicon layer 58 is from about 1000 Å to about 2000 Å thick in the depicted example. Doped polysilicon layer 58 may be formed by using a shallow implant, such as, for example, phosphorous. Polysilicon layer 54 is doped after deposition while polysilicon layer 58 is created by a shallow implant. Thereafter, these layers are patterned and etched to form openings 60 as illustrated in FIG. 7C. In FIG. 7D, dielectric 62 is deposited into opening 60. Dielectric 62 may be deposited into opening 60 using known spin-on-glass materials and methods. Afterwards, additional dielectric 63 is deposited using a chemical vapor deposition dielectric in the depicted example. Openings 65 are etched by reactive ion etching to expose doped polysilicon layer 58 such that ohmic contacts can be provided with metal layer 64 as shown in FIG. 7E. Phosphorous in the depicted example moves through the layers at a temperature from about 850° C. to about 900° C. Chemical vapor deposition is performed from about 550° C. to about 620° C. in the depicted example. Contacts are typically etched with reactive ion etching. Thereafter in FIG. 7E, metal layer 64 is deposited over the structure and patterned and etched to form metal lines. Metal layer 64 is a refractory metal layer and is from about 0.5 micrometers to 1.0 micrometers thick in the depicted example. As mentioned above, this layer may be deposited either with chemical vapor deposition or physical vapor deposition depending on the material employed. Dielectric is deposited to provide scratch and humidity protection.

The one time field programmable interconnect chip can be tested for opens and shorts after it has been packaged in a TAB package prior to programming. Potential connections may be tested by placing a current source between pairs of connections to the TAB frame and forcing a current. The voltage can be measured to determine the punch through voltage for the connection. If the voltage is within the limits, the programmable connection is good. Otherwise, the chip is defective and may need to be replaced.

According to the present invention, a one time, field programmable interconnect chip is provided for developing applications specific multi-chip modules based on standard products. In addition, the programmable interconnect chip employing an antifuse employs processing developed for other types of integrated circuits. Additionally, based on the design of this interconnection chip, it can be applied to various applications in connecting different logic chips. Furthermore, the present invention helps make application specific multi-chip modules practical because it allows for programming of connections without requiring specific designs for each interconnection.

Additionally, the present invention allows for swapping out of various logic chips in modules because already programmed interconnect chips may be replaced with new ones that may be programmed to fit the specifications of new logic chips. Additionally, the interconnect chip of the present invention may be programmed and tested prior to assembly on the substrate, reducing repair and yield problems.

While the invention has been particularly shown and described with reference to a preferred embodiment, it will be understood by those skilled in the art that various changes in form and detail may be made therein without departing from the spirit and scope of the invention.

What is claimed is:

1. An antifuse device comprising:
    a first doped polysilicon layer in electrical connection with a first conductive line;
    an intrinsic polysilicon layer formed over and in contact with the first doped polysilicon layer; and
    a second doped polysilicon layer formed over and in contact with the intrinsic polysilicon layer, the second doped polysilicon layer being in electrical connection with a second conductive line.

2. The antifuse device of claim 1, wherein the first conductive line comprises tungsten.

3. The antifuse device of claim 1, wherein the first doped polysilicon layer is about 200–500 angstroms thick.

4. The antifuse device of claim 1, wherein the intrinsic polysilicon layer is about 5,000–10,000 angstroms thick.

5. The antifuse device of claim 1, wherein the second doped polysilicon layer is about 1,000–2,000 angstroms thick.

6. A method of using the antifuse device of claim 1, comprising the step of applying a voltage across the first conductive line and the second conductive line adequate to cause diffusion of dopants into the intrinsic polysilicon layer sufficient for the intrinsic polysilicon layer to become conductive.

7. A programmable device comprising
   a plurality of first doped polysilicon segments in electrical connection with a first conductive line;
   an intrinsic polysilicon segment disposed on each of the first doped polysilicon segments;
   a second doped polysilicon segment disposed on each of the intrinsic polysilicon segments; and
   a second conductive segment disposed on each of the second doped polysilicon segments.

8. The antifuse device of claim 1, wherein the first conductive line comprises tungsten.

9. The antifuse device of claim 7, wherein the first doped polysilicon segments are about 200–500 angstroms thick.

10. The antifuse device of claim 7, wherein the instrinsic polysilicon segments are about 5,000–10,000 angstroms thick.

11. The antifuse device of claim 7, wherein the second doped polysilicon segments are about 1,000–2,000 angstroms thick.

12. A method of using the antifuse device of claim 7, comprising the step of applying a voltage across the first conductive line and at least some of the second conductive lines adequate to cause diffusion of dopants into the respective intrinsic polysilicon layer sufficient for the respective intrinsic polysilicon layer to become conductive.

* * * * *